(12) United States Patent
Lan et al.

(10) Patent No.: US 10,942,458 B2
(45) Date of Patent: Mar. 9, 2021

(54) EXPOSURE SYSTEM, EXPOSURE DEVICE AND EXPOSURE METHOD

(71) Applicant: SHANGHAI MICRO ELECTRONICS EQUIPMENT (GROUP) CO., LTD., Shanghai (CN)

(72) Inventors: Ke Lan, Shanghai (CN); Yaping Ge, Shanghai (CN); Yonghui Chen, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 5 days.

(21) Appl. No.: 15/999,783

(22) PCT Filed: Feb. 17, 2017

(86) PCT No.: PCT/CN2017/073957
§ 371 (c)(1),
(2) Date: Aug. 20, 2018

(87) PCT Pub. No.: WO2017/140265
PCT Pub. Date: Aug. 24, 2017

(65) Prior Publication Data
US 2019/0163074 A1 May 30, 2019

(30) Foreign Application Priority Data

Feb. 18, 2016 (CN) .......................... 201610092322.2

(51) Int. Cl.
*G03F 7/20* (2006.01)
*B23K 26/00* (2014.01)
(Continued)

(52) U.S. Cl.
CPC ...... *G03F 7/70591* (2013.01); *B23K 26/0006* (2013.01); *B23K 26/042* (2015.10);
(Continued)

(58) Field of Classification Search
CPC .............. B23K 26/0665; B23K 26/032; B23K 26/064; B23K 26/0626; B23K 26/073;
(Continued)

(56) References Cited

U.S. PATENT DOCUMENTS

| 4,642,701 A | * | 2/1987 | Maeda | G02B 27/144 347/256 |
| 5,652,645 A | * | 7/1997 | Jain | G03F 7/2002 355/50 |

(Continued)

FOREIGN PATENT DOCUMENTS

| CN | 1675020 A | 9/2005 |
| CN | 101364053 A | 2/2009 |

(Continued)

*Primary Examiner* — Mesfin T Asfaw
(74) *Attorney, Agent, or Firm* — Muncy, Geissler, Olds & Lowe, P.C.

(57) ABSTRACT

An exposure system (10), an exposure apparatus and an exposure method are disclosed. The exposure system (10) includes: a laser unit (11), a light spot switching unit (12) and a lens unit (13); the laser unit (11) is configured for producing a laser beam; the light spot switching unit (12) is configured to direct the laser beam to travel along one of different optical paths based on a desired size of a light spot for a workpiece to be exposed so that a laser beam in correspondence with the desired size of the light spot is obtained; and the lens unit (13) is configured for altering a direction in which the laser beam is incident on the workpiece. The light spot switching unit (12) enables the laser beam to be switched between the different optical paths so as to form light spots sized in different ranges, which can satisfy different needs of workpieces with various critical dimensions. As a result, an improvement in processing adaptability to different workpieces and a significant reduction in cost can be achieved.

21 Claims, 7 Drawing Sheets

(51) Int. Cl.
*B23K 26/402* (2014.01)
*B23K 26/073* (2006.01)
*B23K 26/36* (2014.01)
*B23K 26/046* (2014.01)
*B23K 26/042* (2014.01)
*B23K 26/352* (2014.01)
*B23K 26/50* (2014.01)
*B23K 26/08* (2014.01)
*B23K 103/00* (2006.01)
*B23K 101/40* (2006.01)

(52) U.S. Cl.
CPC .......... *B23K 26/046* (2013.01); *B23K 26/073* (2013.01); *B23K 26/0853* (2013.01); *B23K 26/352* (2015.10); *B23K 26/36* (2013.01); *B23K 26/402* (2013.01); *B23K 26/50* (2015.10); *G03F 7/70025* (2013.01); *G03F 7/70208* (2013.01); *G03F 7/70383* (2013.01); *B23K 2101/40* (2018.08); *B23K 2103/54* (2018.08)

(58) Field of Classification Search
CPC ...... B23K 26/21; B23K 26/22; B23K 26/042; B23K 26/046; B23K 26/0622; B23K 26/0643; B23K 26/048; B23K 26/0823; B23K 26/0853; B23K 26/04; B23K 26/043; B23K 26/0652; B23K 26/067; B23K 26/083; B23K 26/0861; B23K 26/0876; B23K 26/707; B23K 26/40; B23K 26/38; B23K 26/0613; B23K 26/0734; B23K 26/03; G03F 7/70641; G03F 7/70616; G03F 7/70258; G03F 7/70383; G03F 7/70625; G03F 7/20; G03F 7/2051; G03F 7/2053; G03F 7/70; G03F 7/70025; G03F 7/70091; G03F 7/70158; G03F 7/70191; G03F 7/70208; G03F 7/70275; G03F 7/7055; G03F 7/70558; G03F 7/70591; G03F 7/7085; G03F 9/7023; G03F 9/7026; G03F 9/7065; G03F 9/7073; A61F 9/00821; G02B 26/123; G02B 21/002; G02B 27/0927; G11B 7/0912; G11B 7/1381; G11B 7/1353; G11B 7/1374; G11B 7/1275; G11B 7/1356; G11B 7/131; G11B 7/13922

See application file for complete search history.

(56) References Cited

U.S. PATENT DOCUMENTS

| | | | | |
|---|---|---|---|---|
| 6,383,940 | B1* | 5/2002 | Yoshimura | G03F 7/70075 355/52 |
| 2001/0028443 | A1 | 10/2001 | Yabu | |
| 2007/0242249 | A1* | 10/2007 | Shibazaki | G03B 27/52 355/55 |
| 2012/0171876 | A1 | 7/2012 | Venturini et al. | |

FOREIGN PATENT DOCUMENTS

| | | |
|---|---|---|
| CN | 101487978 A | 7/2009 |
| CN | 102520525 A | 6/2012 |
| CN | 102837125 A | 12/2012 |
| CN | 103293864 A | 9/2013 |
| CN | 203265909 U | 11/2013 |
| JP | 2001203141 A | 7/2001 |
| JP | 2004066327 A | 3/2004 |
| JP | 2006098726 A | 4/2006 |

* cited by examiner

EXPOSURE SYSTEM, EXPOSURE DEVICE AND EXPOSURE METHOD

TECHNICAL FIELD

The present invention relates to the field of semiconductor technology and, in particular, to an exposure system, an exposure apparatus and exposure methods.

BACKGROUND

By virtue of high brightness, excellent monochromaticity, strong directivity and other advantages, laser has been used in various processing applications including laser direct writing, laser packaging, etc. One of the most common applications is the use of a laser galvanometric scanning (LGS) system which processes the surface of a workpiece by irradiating it with a light spot with a certain power density that is formed by a laser beam having passed successively through an expander, a collimator, X- and Y-galvanometer scanners and a focusing field lens. The workpiece is required to be subjected to the laser for a predetermined period of time, which in turn provides a desired amount of energy for the process, thereby enabling the processing of the workpiece.

Different workpiece conditions including line width requires varying light spot sizes. For example, glass frit sealing in the manufacturing of OLED devices requires a light spot size that is twice the line width of the glass frit. Light spots used in roll-to-roll processes are required to be sized in the range from tens of microns to hundreds of microns. Laser micromachining requires a light spot diameter on the order of tens of microns. Most light spots used in laser marking or laser drilling have a diameter ranging from tens of microns to tens of millimeters. At present, workpieces with different line widths have to be handled with different processing devices. Such low adaptability to workpieces can lead to high processing costs.

SUMMARY OF THE INVENTION

It is an objective of the present invention to provide an exposure system, an exposure apparatus and exposure methods. The exposure system is designed to be able to produce light spots that are switchable in field and sized in the range from tens of microns to hundreds of microns and hence can satisfy different needs of workpieces with various critical dimensions. As a result, an improvement in processing adaptability to different workpieces and a significant reduction in cost can be achieved.

The above and other related objectives can be attained by an exposure system according to the present invention, including: a laser unit, a light spot switching unit and a lens unit; the laser unit is configured to produce a laser beam; the light spot switching unit is configured to direct the laser beam to travel along one of a plurality of different optical paths based on a desired size of a light spot for a workpiece to be exposed so that a laser beam in correspondence with the desired size of the light spot is obtained; and the lens unit is configured to alter a direction in which the laser beam is incident on the workpiece.

Optionally, the exposure system determines the desired size of the light spot for the workpiece based on a power density of the light spot that is required to be applied on a surface of the workpiece, selects the one of the plurality of different optical paths based on a comparison of the desired size of the light spot with a threshold light spot size, and controls the light spot switching unit to enable the selected optical path.

Optionally, the light spot switching unit may include a first optical path and a second optical path, the first optical path configured to follow the diffraction-limit principle to generate a first light spot that is adjustable and has a size smaller than the threshold light spot size, the second optical path configured to generate, by geometrical imaging, a second light spot that is adjustable and has a size greater than or equal to the threshold light spot size.

Optionally, the threshold light spot size may be 100 Optionally, the first optical path may be defined by a first reflector, a first aperture, a second reflector and an optical element. In addition, the second optical path may be defined by a focusing lens group, a second aperture and the optical element.

Optionally, the light spot switching unit may further include a beam splitting prism configured to split the laser beam into a first beam following the first optical path and a second beam following the second optical path, and wherein the first optical path or the second optical path may be enabled by controlling an opening or closing status of the first aperture and the second aperture.

Optionally, the laser unit may include: a light source assembly for outputting the laser beam; a beam expansion assembly for expanding the laser beam and hence enlarging the light spot; and a shaping assembly for controlling the shape of the light spot.

Optionally, the lens unit may include a two-dimensional galvanometer scanner and a telecentric field lens; the two-dimensional galvanometer scanner is configured for deflecting the laser beam in an X- or Y-direction and the telecentric field lens is configured for ensuring normal incidence of the laser beam on the workpiece.

The present invention also provides an exposure apparatus, including an exposure system, a workpiece stage and a measurement system, wherein the exposure system is the exposure system as defined above.

Optionally, a workpiece placed on the workpiece stage may be a rigid substrate, wherein the measurement system is configured to align the rigid substrate with the exposure system.

Optionally, a workpiece placed on the workpiece stage may be a flexible substrate, wherein the workpiece stage is a roll-to-roll conveyor.

Optionally, the roll-to-roll conveyor may include: a feed roller and a pickup roller which are disposed in left-right symmetry with each other; and a retention platform configured for absorptive retention of the flexible substrate.

Optionally, the retention platform may include a measurement section and an exposure section.

Optionally, the measurement system may include: an alignment sensor configured to perform a horizontal position measurement; a vertical sensor configured to perform a vertical position measurement; and a motion mechanism capable of moving in multiple degrees of freedom.

Optionally, the exposure apparatus may further include a reticle and a reticle stage; wherein the reticle is configured for replicating identical exposure patterns and the reticle stage is configured to carry the reticle to move in the multiple degrees of freedom.

Accordingly, the present invention also provides two exposure methods using the exposure apparatus as defined above for exposure.

The present invention also provides another exposure method, in which the exposure apparatus as defined above can be used. The exposure method includes the steps of: 1) placing a workpiece on a workpiece stage, wherein the workpiece is in correspondence with a deired size of a light spot that is determined based on a power density of the light spot that is required to be applied on a surface of the workpiece; 2) comparing the desired size of the light spot with a threshold light spot size to obtain a comparison result; 3) selecting one of a plurality of different optical paths based on the comparison result and enabling the selected optical path by a light spot switching unit; and 4) producing, by a laser unit, a laser beam which is directed along the selected optical path and exposes a pattern on a reticle onto the workpiece.

Optionally, in step 3, the light spot switching unit may include a first optical path and a second optical path, the first optical path configured to follow the diffraction-limit principle to generate a first light spot that is adjustable and has a size smaller than the threshold light spot size, the second optical path configured to generate, by geometrical imaging, a second light spot that is adjustable and has a size greater than or equal to the threshold light spot size.

Optionally, the threshold light spot size may be 100 µm.

Optionally, the exposure method may further include, prior to step 4, a measurement step in which the workpiece undergoes an alignment measurement and/or a vertical measurement.

Optionally, in step 1, the workpiece may be a rigid substrate, wherein an alignment measurement with respect to an exposure position is performed on the rigid substrate prior to step 4.

Optionally, in step 1, the workpiece placed on the workpiece stage may be a flexible substrate, wherein both an alignment measurement and a vertical measurement with respect to an exposure position are performed on the flexible substrate prior to step 4, and wherein the workpiece stage is a roll-to-roll conveyor.

Optionally, the roll-to-roll conveyor may include: a feed roller and a pickup roller which are disposed in left-right symmetry with each other; and a retention platform configured for absorptive retention of the flexible substrate.

Optionally, the retention platform may include a measurement section and an exposure section.

Compared to the prior art, the exposure system, exposure apparatus and exposure methods of the present invention offers the following advantages:

1. The light spot switching unit enables the laser beam to be switched between the different optical paths so as to form light spots sized in different ranges, which can satisfy different needs of workpieces with various critical dimensions. As a result, an improvement in processing adaptability to different workpieces and a significant reduction in cost can be achieved.

2. The reticle in the exposure apparatus allows higher light spot location accuracy which is conducive to exposure uniformity.

3. A significant improvement in the throughput can be achieved by the retention platform incorporated in the roll-to-roll conveyor and including the measurement section and the exposure section, on which different portions of the flexible substrate are retained and undergo simultaneous horizontal and vertical position measurements by the measurement system and exposure by the exposure system, respectively.

DETAILED DESCRIPTION OF PREFERRED EMBODIMENTS

The present invention will be described below in further detail with reference to the accompanying drawings so that it will become more readily apparent. Of course, the invention is not limited to the specific embodiments disclosed herein and is intended to embrace all general substitutions well known to those skilled in the art.

In addition, the drawings are presented in a schematic manner possibly not drawn to scale and possibly with exaggerations, for the sake of facilitated illustration, without limiting the scope of the present invention.

The core concept of the present invention is to provide an exposure system incorporating a switching unit configured to switch a laser beam between different optical paths so that light spots with different size ranges can be created to address workpieces with various critical dimensions, thereby allowing higher workpiece adaptability as well as savings in processing costs.

Embodiment 1

Figure 1:
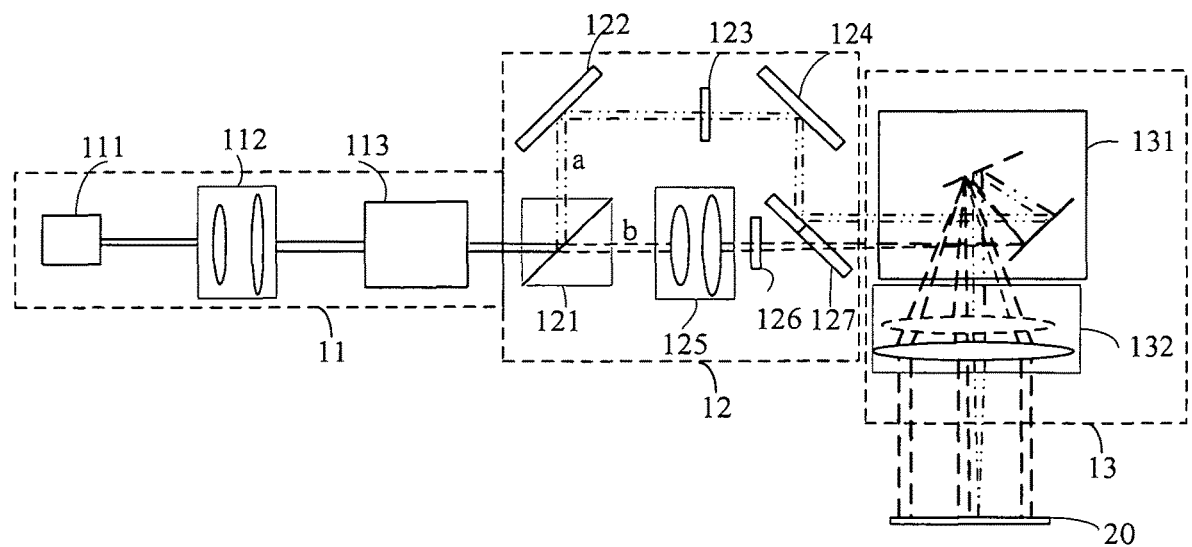
FIG. 1 is a structural schematic of an exposure system constructed in accordance with a first embodiment of the present invention.

Reference is now made to FIG. 1, a structural schematic of an exposure system constructed in accordance with Embodiment 1. As illustrated, the exposure system 10 includes: a laser unit 11, a light spot switching unit 12 and a lens unit 13. The laser unit 11 is configured to produce a laser beam; the light spot switching unit 12 is configured to cause the laser beam propagate between different optical paths based on a light spot size demanded by a workpiece to be processed, obtaining the laser beam in correspondence with the light spot size; and the lens unit 13 is configured to alter a direction in which the laser beam is incident.

The exposure system 10 determines the light spot size demanded by the corresponding workpiece base on a power density required to be applied on the surface of the workpiece, and controls the light spot switching unit to switch the laser beam based on a comparison of the determined light spot size with a threshold light spot size.

The laser unit 11 may include: a light source assembly 111 for outputting the laser beam; a beam expansion assembly 112 for expanding the laser beam and hence enlarging the light spot; and a shaping assembly 113 for controlling the shape of the light spot. The light spot switching unit 12 may include a first optical path a and a second optical path b. The first optical path a may follow the diffraction-limit principle to create a first light spot that is adjustable and has a size smaller than the threshold light spot size. The second optical path b may create, by geometrical imaging, a second light spot that is adjustable and has a size greater than or equal to the threshold light spot size. The threshold light spot size may be 100 μm. The first optical path a may be defined by a first reflector 122, a first aperture 123, a second reflector 124 and an optical element 127. The second optical path b may be defined by a focusing lens group 125, a second aperture 126 and the optical element 127. The light spot switching unit 12 may further include a beam splitting prism 121. The beam splitting prism 121 is configured to split the laser beam into a first beam following the first optical path a and a second beam following the second optical path b. The first aperture 123 and the second aperture 126 may be closed and opened to make the laser beam propagate along a desired one of the aforementioned optical paths. The lens unit 13 may include: a two-dimensional galvanometer scanner 131 and a telecentric field lens 132. The two-dimensional galvanometer scanner 131 is configured to deflect the laser beam in the X- or Y-direction; and the telecentric field lens 132 is configured to make sure that the laser beam is incident normally on the workpiece 20.

The light source assembly 111 may produce single-wavelength light ranging from the ultraviolet to the infrared spectrum or broad-spectrum light with a wavelength bandwidth of smaller than 100 nm. The light source wavelength may be selected based on the material properties of the workpiece 20. The beam expansion assembly 112 is configured for expansion of the laser beam so that the size of the light spot can be adjusted in field to address the needs of different workpieces. The shaping assembly 113 can trim the beam into any desired shape that allows more uniform exposure. The shaping assembly 113 may be usually implemented as a diffractive optical element (DOE), a microlens array or the like, and the light spot may be usually trimmed into, for example, a truncated, square, "M"-like shape.

A ratio of the first and second beams resulting from the splitting of the laser beam by the beam splitting prism 121 may be determined by the power density desired to be incident on the workpiece. The first reflector 122 and the second reflector 124 are configured to reflect the first beam, and the aperture 123 is adapted to allow the passage of, or block, the first beam. The focusing lens group 125 is configured to collimate the second beam, and the second aperture 126 is adapted to allow the passage of, or block, the second beam. An upper portion of the optical element 127 is capable of reflecting the first beam and a lower portion of the optical element 127 is capable of allowing transmission of the second beam.

In this embodiment, the first beam follows the first optical path a which involves the light source assembly 111, the beam expansion assembly 112, the shaping assembly 113, the beam splitting prism 121, the first reflector 122, the first aperture 123, the second reflector 124, the optical element 127, the two-dimensional galvanometer scanner 131 and the telecentric field lens 132, while the second beam follows the second optical path b which involves the light source assembly 111, the beam expansion assembly. 112, the shaping assembly 113, the beam splitting prism 121, the focusing lens group 125, the second aperture 126, the optical element 127, the two-dimensional galvanometer scanner 131 and the telecentric field lens 132.

The first aperture 123 and the second aperture 126 may be closed or opened based on the size of the light spot required by the workpiece 20. For example, when a high power density is required to be applied on the surface of the workpiece, the first aperture 123 may be opened, with the second aperture 126 remaining closed, so that a small light spot sized smaller than 100 μm results from the first optical path that follows the diffraction-limit principle. On the contrary, if the second aperture 126 is opened and the first aperture 123 is closed, the second optical path will result in, by geometrical imaging, a light spot larger than that resulting from the first optical path. Thus, if a light spot sized smaller than 100 μm is needed, the first optical path may be enabled. Otherwise, if a light spot sized not smaller than 100 μm is needed, the second optical path may be enabled.

The two-dimensional galvanometer scanner 131 is configured to deflect the first beam or second beam in the X- or Y-direction so that the workpiece can be scanned by the first beam or second beam as desired. The telecentric field lens 132 is configured to ensure the laser beam to be irradiated normally on the workpiece to avoid vertical crosstalk that may arise from oblique incidence.

The laser beam output from the light source assembly 111 is a parallel beam which is then expanded by the beam expansion assembly 112 and trimmed by the shaping assembly 113. The trimmed beam is split by the beam splitting prism 121 into the first beam and the second beam. In case of the first optical path to be enabled, the first beam propagates sequentially across the first reflector 122, the first aperture 123 and the second reflector 124 and is then reflected by the optical element 127 onto the two-dimensional galvanometer scanner 131. After exiting the two-dimensional galvanometer scanner, it is converged by the telecentric field lens 132 onto the workpiece 20. In case of the second optical path to be enabled, the second beam passes sequentially through the focusing lens group 125, the second aperture 126 and the optical element 127 and is then incident on the two-dimensional galvanometer scanner 131. After exiting the two-dimensional galvanometer scanner 131, it is imaged by the telecentric field lens 132 on the workpiece 20.

As apparent from the above description, the light spot switching unit in the exposure system of the present invention enables the laser beam to be switched between the different optical paths so as to form different light spots sized in different ranges, which can satisfy different needs of workpieces with various critical dimensions. As a result, an improvement in processing adaptability and a significant reduction in cost can be achieved.

Embodiment 2

An exposure apparatus according to the present invention includes a workpiece stage and a measurement system. The exposure system may incorporate the exposure system of Embodiment 1.

Figure 2:
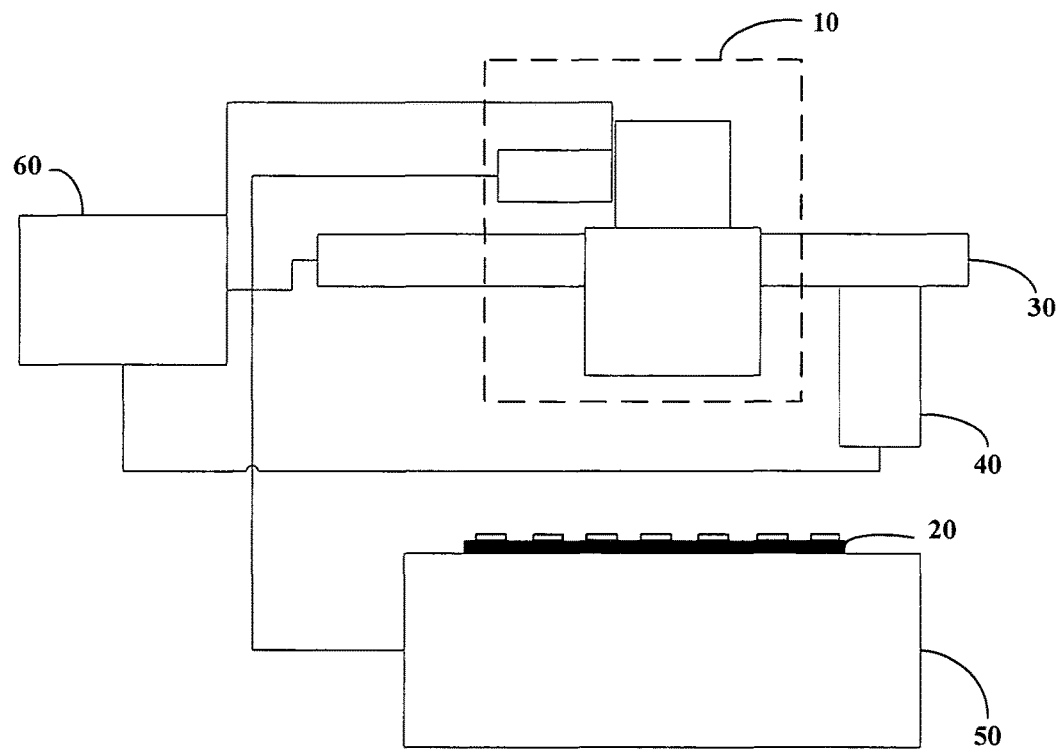
FIG. 2 is a structural schematic of an exposure apparatus constructed in accordance with a second embodiment of the present invention.

Reference is now made to FIG. 2, a structural schematic of the exposure apparatus constructed in accordance with Embodiment 2. As shown in the figure, the exposure apparatus includes essentially: the exposure system 10 that is configured for exposure of the workpiece 20; a motion stage 30 configured to enable horizontal movement of the exposure system 10; the measurement system 40 that is configured to measure the position of the workpiece 20; the workpiece stage 50 that is configured to carry the workpiece 20 and adjust its position and orientation; and a master control system 60 for controlling the exposure system 10, the motion stage 30 and the workpiece stage 50. The exposure system 10 may be mounted on the motion stage 30 so that it can move with the motion stage 30 in multiple horizontal directions. Similarly, the measurement system 40 may be mounted on the motion stage 30 so that it can move with the motion stage 30 in multiple horizontal directions.

Figure 3:
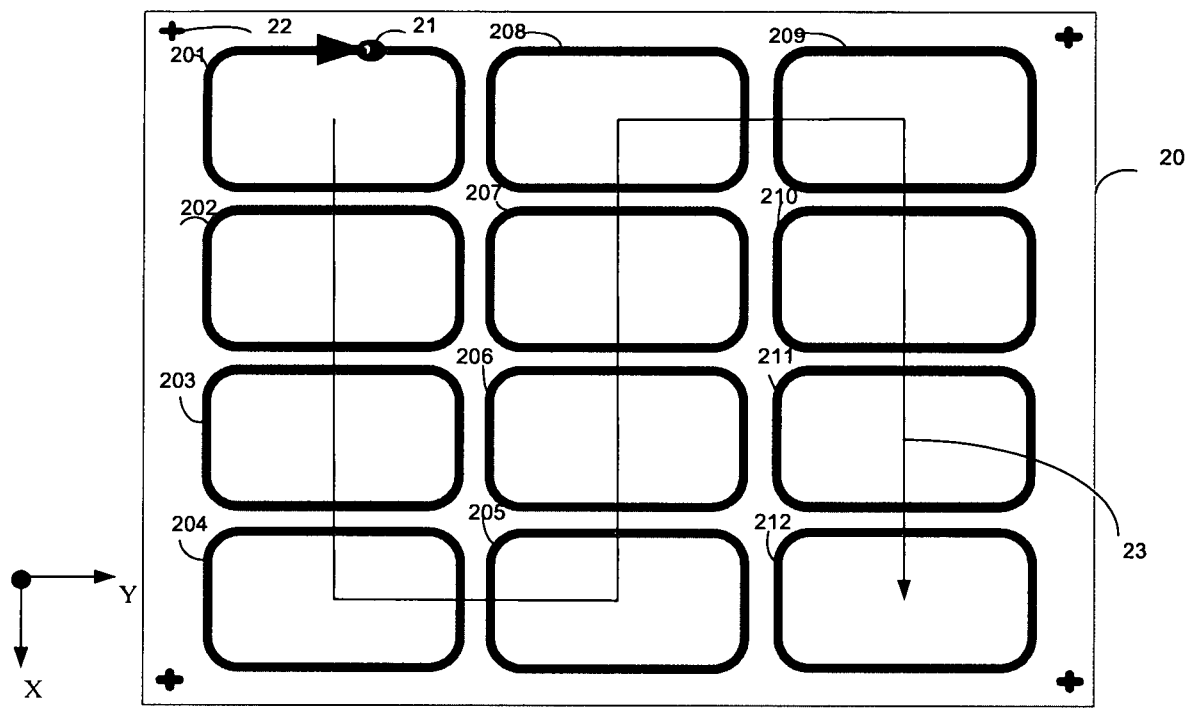
FIG. 3 is a schematic top view of a workpiece to be processed in accordance with the second embodiment of the present invention.

The workpiece 20 may be a rigid substrate. In this embodiment, the workpiece 20 is a glass substrate with a plurality of OLED panels arranged thereon, and a top view of it is shown in FIG. 3. The workpiece 20, i.e., the glass substrate, is shown to be provided thereon with 12 glass frit patterns 201-212 that are to be exposed to allow packaging of the OLED panels, as well as, with alignment marks 22. In this embodiment, there are four alignment marks 22. Also shown in the figure is a light spot 21 moving, at a certain time instant, along a scanning direction indicated by the arrow. The patterns to be exposed are not limited to the shape and number shown in FIG. 3 because any suitable patterns are also possible. In addition, this embodiment is also applicable to larger or smaller workpieces as well as to a different number of different patterns. The measurement system 40 is provided to enable alignment of the glass substrate to the exposure system 10.

With continued reference to FIG. 2, the workpiece 20 is placed on the workpiece stage 50 and the workpiece 20 is moved to under the measurement system 40. The measurement system 40 measures the alignment marks 21 on the workpiece so as to allow the master control system 60 to determine exposure positions suitable for exposure. Adjustments are then made by means of the workpiece stage 50 so that the workpiece 20 is so oriented as to allow it to be exposed as desired. The motion stage 30 on which the exposure system 10 is mounted moves to a first exposure position where a scanning field of view of the exposure system 10 encompasses the patterns 201 and 202, and where, under the control of the master control system 60, the exposure system 10 performs an exposure scan on the pattern 201 under pre-defined process conditions, wherein, the light source assembly 111 is deactivated at the end of the exposure scan of the pattern 201. The pattern 202 is then exposure-scanned by the exposure system 10 in the same manner, wherein, the light source assembly 111 is deactivated at the end of the exposure scan of the pattern 202. Afterward, the motion stage 30 moves with the exposure system 10 to the next one of the exposure positions, and the aforementioned process is repeated. The path that the motion stage travels from the first to the last exposure positions during the exposure process is shown as the curve 23 in FIG. 3. According to the present invention, a plurality of such measurement systems and exposure systems may also be employed in order for a higher throughout to be achieved.

In this embodiment, the exposure light source may be implemented as a 940-nm laser, with the light spot being sized as 0.6 mm, the second optical path being enabled, and the first optical path being disabled. In addition, while the scanning field of view of the exposure system 10 has been described above as encompassing two of the patterns along the X-direction at each of the determined positions in this embodiment, the present invention is not so limited, because the scanning field of view of the exposure system may also be enlarged or shrunk, and the number of patterns to be exposed that the scanning field of view encompasses at each of the determined positions may be determined together by the size of the scanning field of view and that of each pattern. The design of travel path for the exposure system 10 may take into account the sizes of the scanning field of view and the workpiece 20. Further, if the scanning field of view is designed to large enough to encompass all of the patterns, there will be no need to move the exposure system 10 at all after each exposure scan.

According to this embodiment, the process parameters P and v satisfies the following control equation for the softening temperature T of the glass frit (at which the bonding or sealing is conducted):

$$T=KP/(\alpha^2 \sqrt{v} D \epsilon L) \tag{1}$$

where, K denotes the thermal conductivity of the glass frit, which is different from that of the electrode lead regions; P, the effective laser incident power, which is adjustable; $\alpha$, the diameter of the light spot, which is adjustable by trimming the exposure beam or changing the amount of defocus; v, the scanning speed by the light spot, which is adjustable but recommended only to be changed prudently because it affects the throughout; D, the thermal diffusion coefficient, which is determined by the properties of the material; e, the heat absorption coefficient of the material; and L, the thickness of the glass frit, which is determined by the requirements of the OLED manufacturing process.

As can be seen from control equation 1), the softening temperature T of the glass frit is proportional to the effective incident power P and inversely proportional to the square of the light spot diameter ($\alpha^2$) and the square root of the scanning speed ($v^{1/2}$) and the three parameters are closely correlated. Therefore, in order to ensure that the softening temperature of the glass frit is consistent and stable (generally about 350° C.), the effective incident power P and the scanning speed v need to be synchronously controlled during the OLED panel packaging process.

Embodiment 3

Another exposure apparatus according to the present invention includes an exposure system, a workpiece stage and a measurement system. The exposure system may be implemented as the exposure system of Embodiment 1.

The workpiece may be a flexible substrate. In this embodiment, the workpiece is a flexible conductive film, and accordingly, the workpiece stage is a roll-to-roll conveyor.

Figure 4:
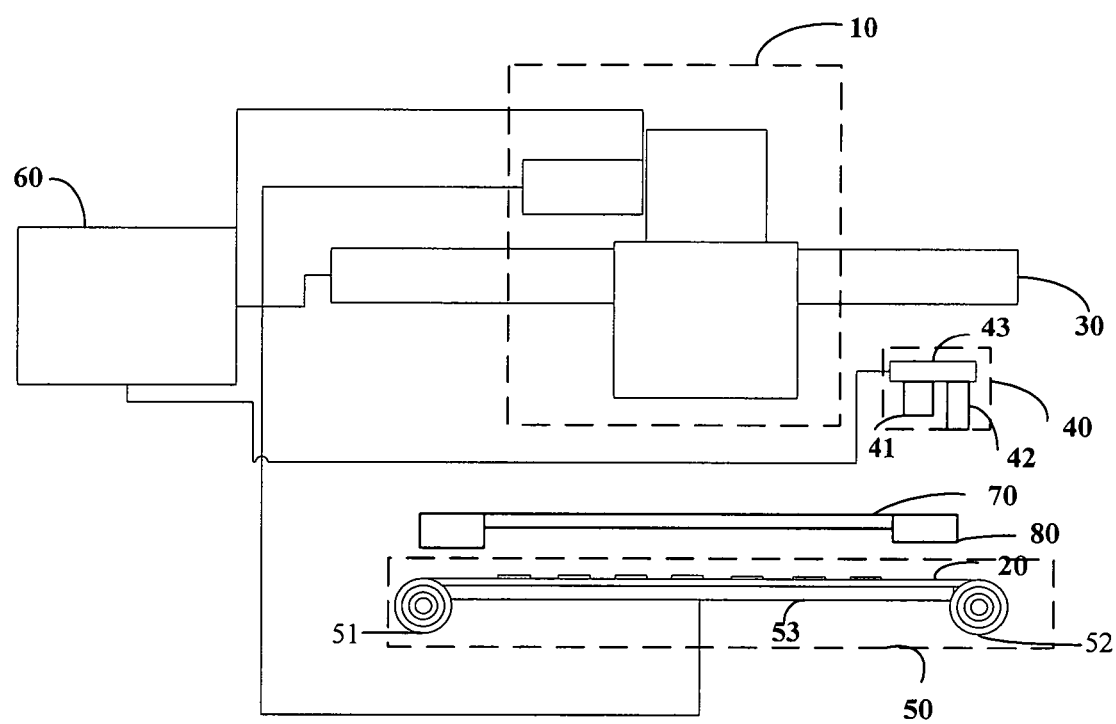
FIG. 4 is a structural schematic of an exposure apparatus constructed in accordance with a third embodiment of the present invention.

Reference is now made to FIG. 4, a structural schematic of the exposure apparatus constructed in accordance with Embodiment 3. As shown in figure, the exposure apparatus includes essentially: the exposure system 10 configured to expose the flexible conductive film 20; a motion stage 30 for enabling movement of the exposure system 10 in multiple degrees of freedom; the measurement system 40 for measuring the position of the flexible conductive film 20; the roll-to-roll conveyor 50; a reticle 70 adapted to replicate identical exposure patterns; a reticle stage 80 configured to carry the reticle 70 to move in multiple degrees of freedom; and a master control system 60 for controlling the exposure system 10, the motion stage 30, the reticle stage 80 and the roll-to-roll conveyor 50. The reticle 70 is held above the flexible conductive film 20 adapted to replicate exposure patterns on the flexible conductive film 20. The vertical distance between the flexible conductive film 20 and the reticle 70 is smaller than a depth of focus of the measurement system 40.

The exposure system 10 is mounted on the motion stage 30 and hence movable with the motion stage 30 in multiple degrees of freedom. The measurement system 40 includes an alignment sensor 41 for horizontal position measurement, a vertical sensor 42 for vertical position measurement, and a motion mechanism 43 capable of movement in multiple degrees of freedom. The roll-to-roll conveyor 50 includes a feed roller 51, a pickup roller 52 disposed in left-right symmetry with respect to the feed roller, and a retention platform 53 configured for absorptive retention of the flexible conductive film. The flexible conductive film 20 has one end wound on the feed roller 51 and the other end on the pickup roller 52. The retention platform 53 is adapted to retain the flexible conductive film between the feed roller 51 and the pickup roller 52.

Figure 5:
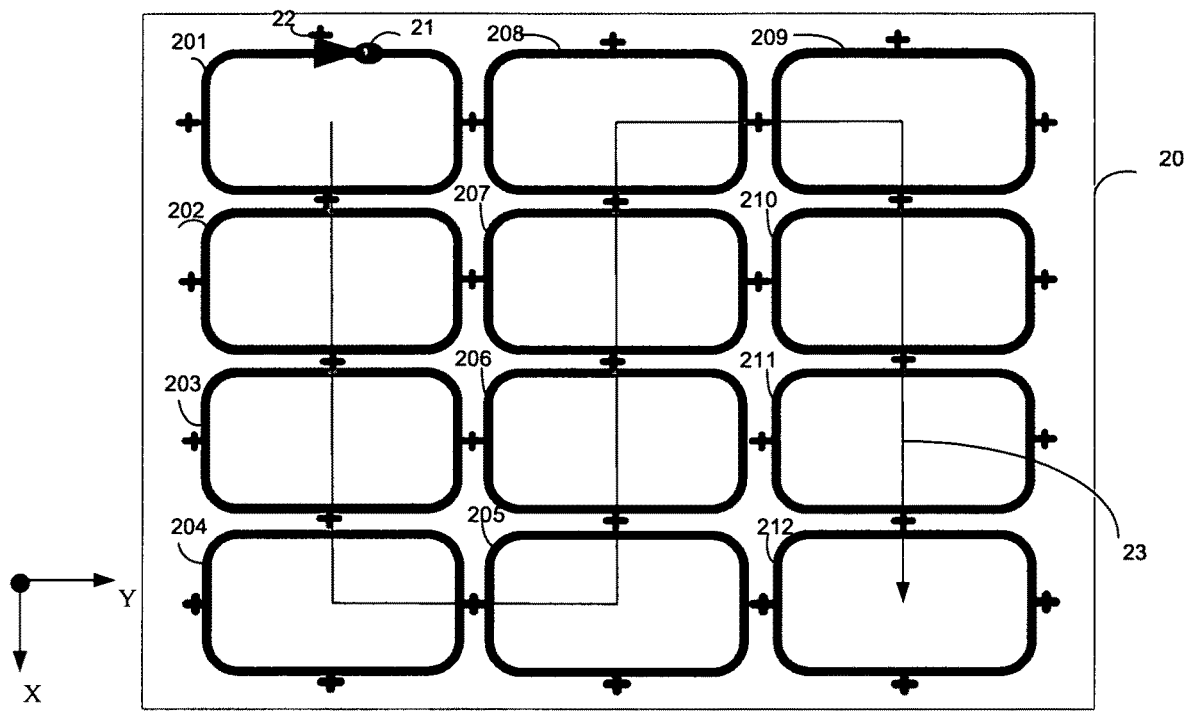
FIG. 5 is a schematic top view of a flexible conductive film in accordance with the third embodiment of the present invention.

In this embodiment, the flexible conductive film 20 is suitable for roll-to-roll processing, and FIG. 5 shows a schematic top view of it. On the flexible conductive film 20, there are formed-twelve patterns 201-212 to be exposed as well as alignment marks 22. Also shown in the figure is a light spot 21 moving, at a certain time instant, along a scanning direction indicated by the arrow. Apart from the illustrated flexible film, the flexible conductive film 20 may also be implemented as any other suitable workpiece. Additionally, the patterns to be exposed on the workpiece are not limited to the shape and number shown in FIG. 5 because any suitable patterns are also possible. The patterns may have a critical dimension ranging from tens of microns to hundreds of millimeters. The present invention is also applicable to larger or smaller workpieces as well as to a different number of different patterns. The design of travel path for the exposure system 10 may take into account the size of its scanning field of view and the size of the workpiece size. If the scanning field of view is designed to large enough to encompass all of the patterns to be exposed, there will be no need to move the exposure system 10 after each exposure scan.

Figure 6:
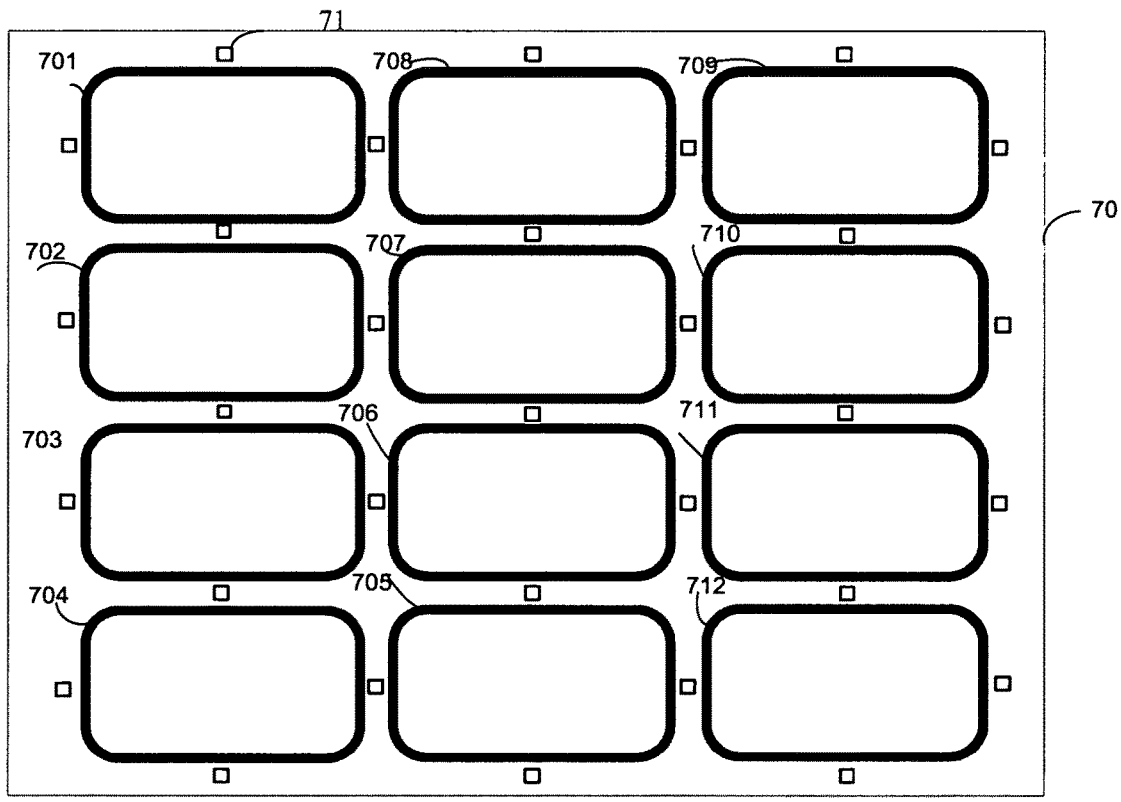
FIG. 6 is a structural schematic of a reticle in accordance with the third embodiment of the present invention.

FIG. 6 shows a structural schematic of the reticle 70 which is sized equally to the portion of the flexible conductive film 20 that is retained flat. The reticle is provided with the same number of patterns of the same shape as the equidistantly-arranged patterns of FIG. 5 to be exposed. The reticle 70 is also provided with alignment marks 71 for the alignment of the reticle. In the figure, the black lines indicate opaque areas, while the remainder represents light-transmitting areas.

As noted above, the flexible conductive film 20 has one end wound on the feed roller 51 and the other end on the pickup roller 52. The retention platform 53 is adapted to retain the flexible conductive film 20 between the feed roller 51 and the pickup roller 52. Upon the measurement system 40 moving above the reticle 70, the measurement system 40 measures the alignment marks 71 on the reticle, the alignment marks 22 on the workpiece and the patterns to be exposed, and the master control system 60 then calculates, based on the measurement, an orientation (X, Y, Rz, Z, Rx and Ry) of the reticle suitable for the exposure of the pattern 201. After the reticle is adjusted to the orientation by the reticle stage 80, the motion stage 30 and hence the exposure system 10 moves to a first exposure position (where the scanning field of view of the exposure system 10 encompasses the patterns 201 and 202), and where, under the control of the master control system 60, the exposure system 10 is activated under pre-defined process conditions so that an exposure beam is generated by the exposure system 10, which then passes through the reticle 70 to create an exposure pattern that coincides with and exposes the exposure pattern 201, wherein, the light source assembly 111 is deactivated at the end of the exposure scan of the pattern 201. After the exposure of the pattern 201 is completed, the light source assembly 111 is deactivated. At the same time as the exposure of the pattern 201, the measurement system 40 is moved to the next position to conduct a similar measurement. Based on this measurement, the master control system 60 recalculates the orientation of the reticle suitable for the exposure of the pattern 202, followed by the reticle stage 80 adjusting the reticle to the orientation. With this done, under the control of the master control system 60, the exposure system 10 is again activated under pre-defined process conditions (including exposure power, light spot diameter and scanning speed, which are all derived from the required exposure energy), so that an exposure beam is generated by the exposure system 10 and passes through the reticle 70 to create an exposure pattern that coincides with and exposes the exposure pattern 202. After the exposure of the pattern 201 is completed, the light source assembly 111 is again deactivated. This process is repeated until all the patterns above the retention platform are so processed. The path that the motion stage 30 moves the exposure system 10 from the first to the last exposure position during the exposure process is shown as the curve 23 in FIG. 5. Subsequently, the feed roller 51 and the pickup roller 52 rotate to cause the next portion of the flexible conductive film 20 to be exposed to advance above the retention platform 53, and the foregoing process is repeated until all the patterns on the workpiece are exposed. According to this embodiment, with the aid of the reticle, the light spot is more accurately located and the exposure is thus accomplished with higher uniformity. According to the present invention, the reticle may also be omitted depending on the required location accuracy of the light spot, and multiple measurement systems 40 may be incorporated instead to achieve a higher throughput.

In this embodiment, the exposure light source may be implemented as a 355-nm laser, with the light spot being sized as 4 mm, the second optical path being enabled, and the first optical path being disabled. In addition, while the scanning field of view of the exposure system 10 has been described above as encompassing two of the patterns along the X-direction at each of the determined positions in this embodiment, the present invention is not so limited, because the scanning field of view of the exposure system may also be enlarged or shrunk, and the number of patterns to be exposed that the scanning field of view encompasses at each of the determined positions may be determined together by the size of the scanning field of view and that of each pattern, and the scanning field of view may also encompass patterns along the Y-direction.

Figure 7:
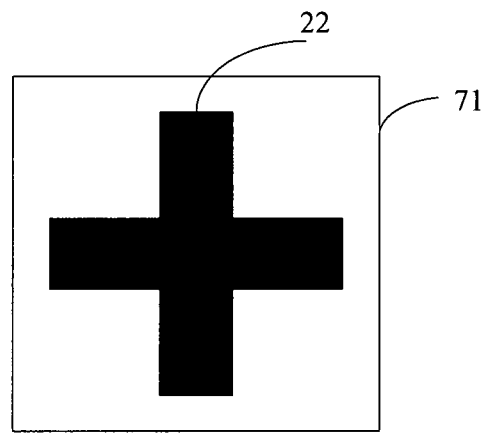
FIG. 7 schematically illustrates images of alignment marks in a measurement system in accordance with the third embodiment of the present invention.
Figure 8:
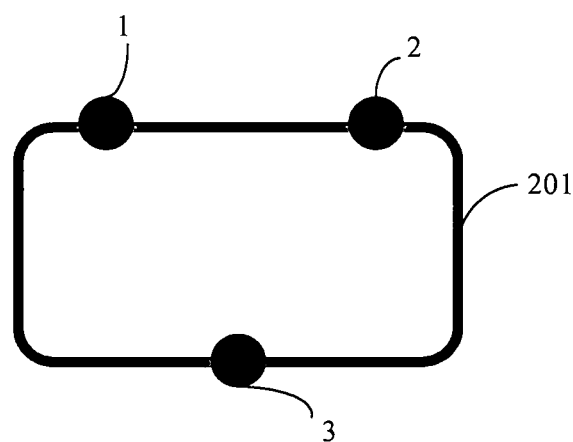
FIG. 8 is a diagram showing a distribution of points measured in a vertical measurement performed by the measurement system in accordance with the third embodiment of the present invention.

FIG. 7 schematically shows images of an alignment mark 71 on the reticle and a corresponding alignment mark 22 on the workpiece formed by the measurement system 40. These alignment marks may take other forms as long as their spatial positions allow both of them to be imaged in a field of view of the measurement system. FIG. 8 shows three points that are measured in the vertical position measurement performed by the measurement system 40, in which 201 indicates a pattern to be exposed.

Embodiment 4

Figure 9:
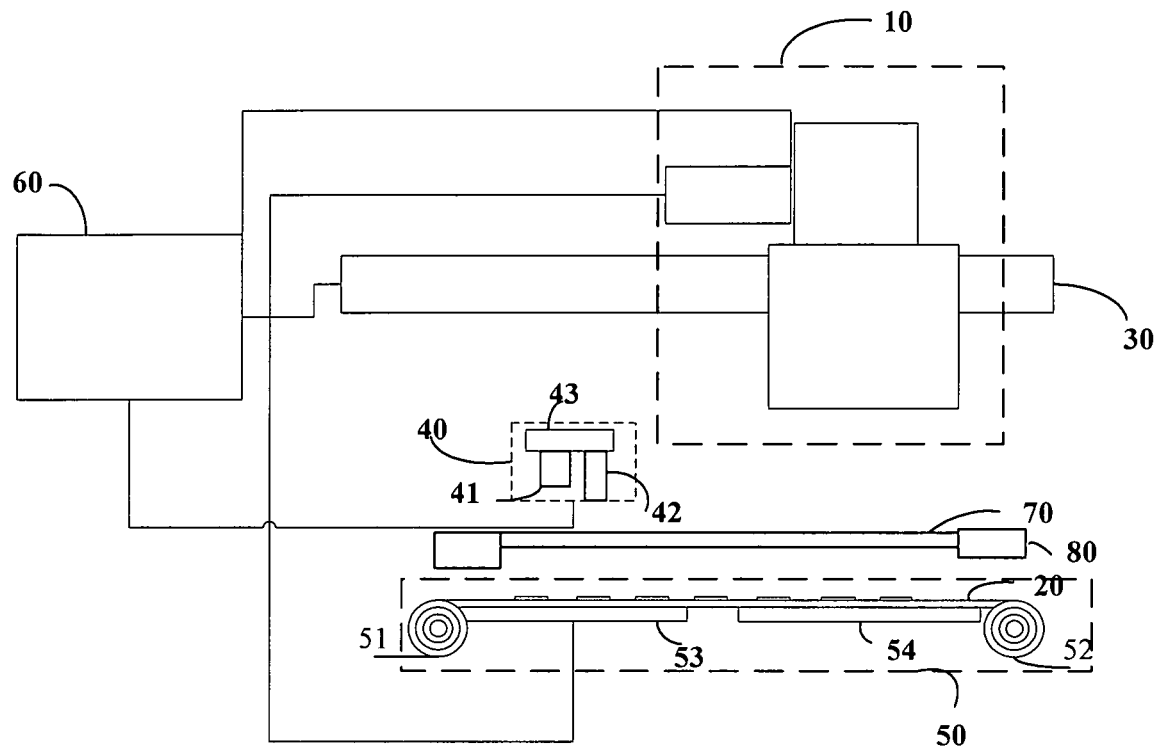
FIG. 9 is a structural schematic of an exposure apparatus constructed in accordance with a fourth embodiment of the present invention.

An exposure apparatus according to the present invention, which, as shown in FIG. 9, differs from that of Embodiment 3 in that the retention platform includes: a measurement section 53 and an exposure section 54. The exposure section 54 is configured for absorptive retention of a portion of the flexible conductive film 20 under exposure. The measurement section 53 is configured for absorptive retention of a portion of the flexible conductive film 20 under measurement. In other words, the flexible conductive film 20 first undergoes position measurement by the measurement system 40 on the measurement section 53 and the flexible conductive film 20 is then moved to the exposure section 54. Afterwards, the flexible conductive film 20 is exposed by the exposure system 10 in the exposure section 54. Concurrently, the measurement system 40 is capable of simultaneous horizontal and vertical position measurements for the next flexible conductive film 20 in the measurement section 53, resulting in a significant improvement in the throughout.

Embodiment 5

Figure 10:
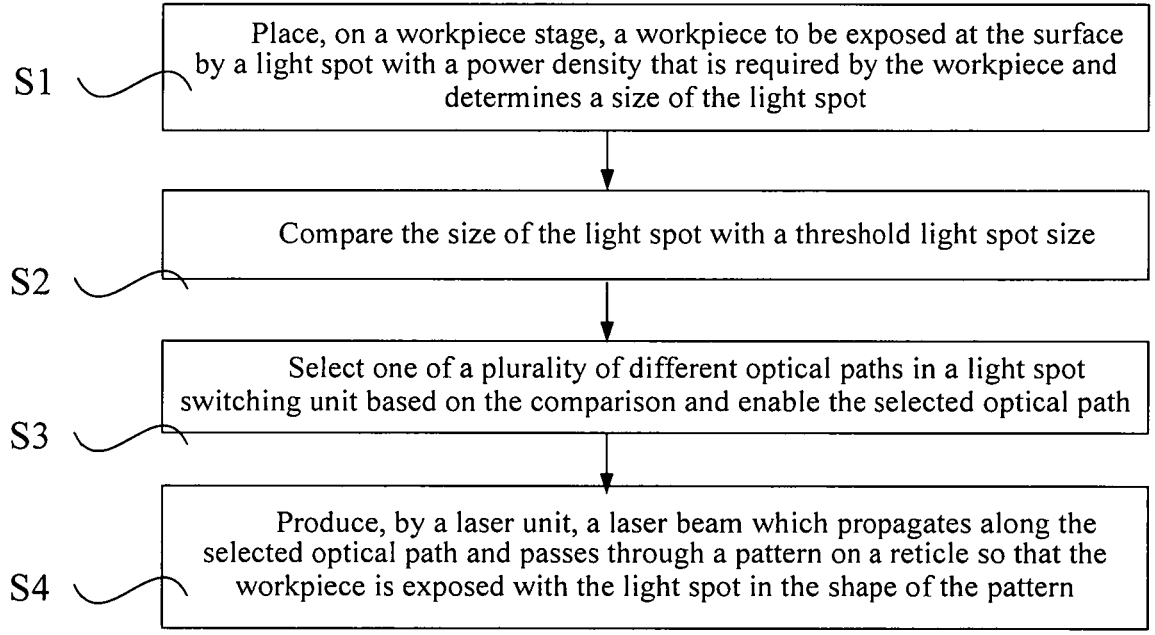
FIG. 10 is a flowchart graphically illustrating an exposure method according to a fifth embodiment of the present invention.

An exposure method according to the present invention using the exposure apparatus as defined above includes, as shown in FIG. 10, the following steps.

In step S1, a workpiece to be exposed at the surface by a light spot is placed on the workpiece stage. The light spot has a power density which is required by the workpiece and determines a size of the light spot.

In step S2, the size of the light spot is compared with a threshold light spot size to obtain a comparison result.

In step S3, one of the optical paths in the light spot switching unit is selected based on the comparison result.

In step S4, the laser unit produces a laser beam which propagates along the selected optical path and passes through a pattern on a reticle so that the workpiece is exposed with the light spot in the shape of the pattern.

Where, in step S3, the light spot switching unit includes the first optical path and the second optical path. The first optical path follows the diffraction-limit principle to result in a first light spot that is adjustable and smaller than the threshold light spot size. The second optical path can result in, by geometrical imaging, a second light spot that is adjustable and larger than the threshold light spot size. The threshold light spot size may be 100 µm. The method may further include, prior to step S4, a measurement step in which the workpiece undergoes an alignment measurement and/or a vertical measurement.

In step S1, the workpiece may be a rigid substrate. In this case, the rigid substrate undergoes an alignment measurement prior to step S4. In step S1, the workpiece may alternatively be a flexible substrate. In this case, the flexible substrate undergoes both an alignment measurement and a vertical measurement prior to step S4, and the workpiece stage may be implemented as a roll-to-roll conveyor which includes a feed roller, a pickup roller disposed in left-right symmetry with respect to the feed roller, and a retention platform configured for absorptive retention of the flexible substrate. The retention platform may include a measurement section and an exposure section.

Embodiment 6

An exposure method according to the present invention utilizes the exposure apparatus of Embodiment 2.

Figure 11:
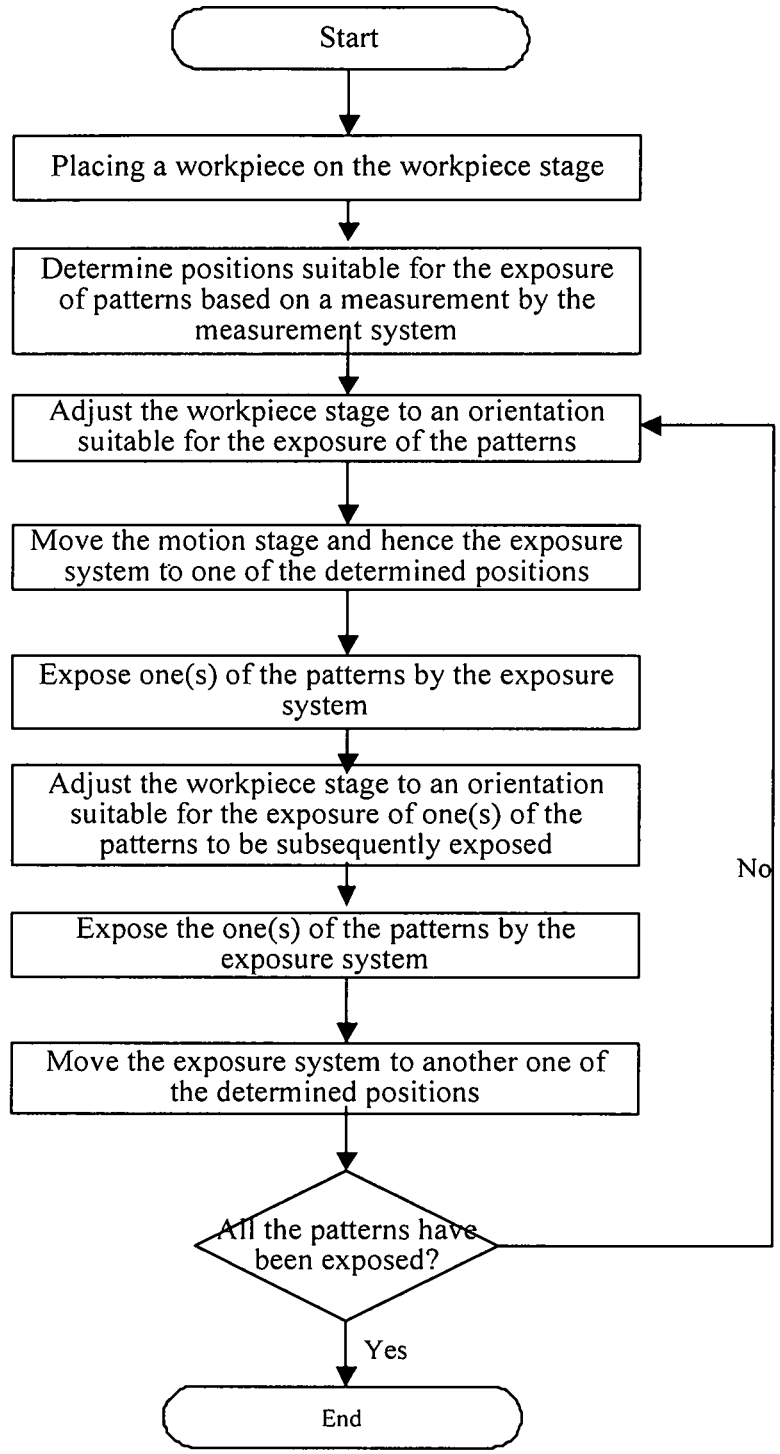
FIG. 11 is a flowchart graphically illustrating an exposure method according to a sixth embodiment of the present invention.

FIG. 11 is a flow chart graphically illustrates the exposure method according to Embodiment 6. As shown, the exposure method includes the steps of:

step S1) placing a workpiece 20 on the workpiece stage 50;

step S2) determining positions suitable for the exposure of patterns to be exposed based on a measurement performed by the measurement system 40 on alignment marks 21 on the workpiece;

step S3) adjusting the workpiece stage 50 to an orientation suitable for the exposure of the patterns;

step S4) moving the motion stage 30 and hence the exposure system 10 to one of the exposure positions;

step S5) exposing one(s) of the patterns by the exposure system 10;

step S6) adjusting the workpiece stage 50 to an orientation suitable for the exposure of one(s) of the patterns to be subsequently exposed;

step S7) exposing the one(s) of the patterns by the exposure system 10;

step S8) moving the exposure system 10 to another one of the exposure positions; and step S9) repeating steps S3-S8 until all of the patterns on the workpiece 20 have been exposed.

In the method, step S8 may be omitted if the scanning field of view of the exposure system 10 can entirely encompass the workpiece 20.

Embodiment 7

An exposure method according to the present invention utilizes the exposure apparatus of Embodiment 3.

Figure 12:
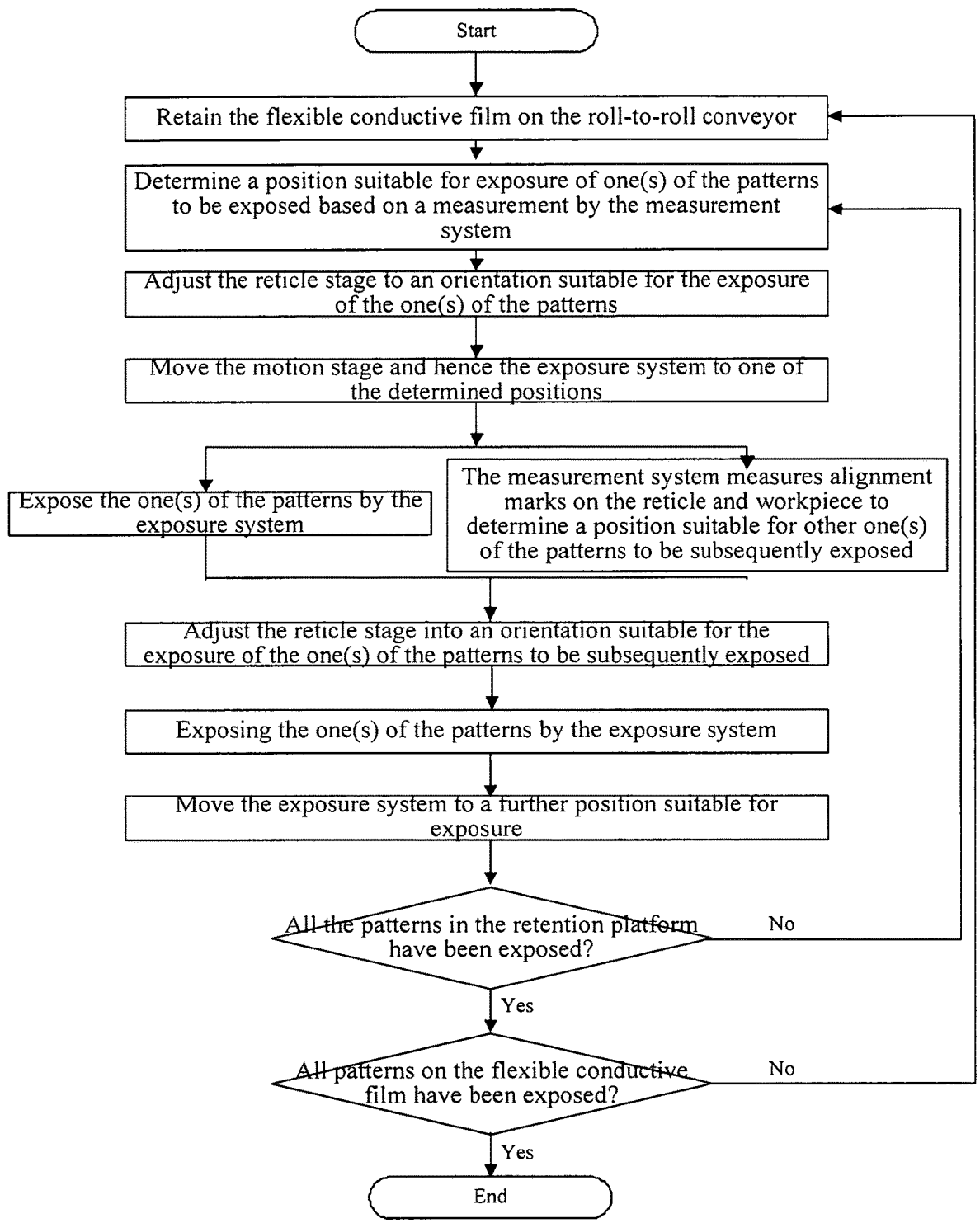
FIG. 12 is a flowchart graphically illustrating an exposure method according to a seventh embodiment of the present invention.

FIG. 12 is a flow chart graphically illustrates the exposure method according to Embodiment 7. As shown in FIG. 12, the exposure method includes the steps of:

step S1) wounding one end of the flexible conductive film 20 on the feed roller 51 and the other end on the pickup roller 52, such that the flexible conductive film 20 is retained on the retention platform 53 between the feed roller 51 and the pickup roller 52;

step S2) moving the measurement system 40 above the reticle 70 and determining a position suitable for the exposure of one(s) of patterns to be exposed based on a measurement of the measurement system performed on the alignment marks 71 on the reticle, the alignment marks 22 on the workpiece and the patterns to be exposed;

step S3) adjusting the reticle stage 80 to an orientation suitable for the exposure of one(s) of the patterns;

step S4) moving the motion stage 30 and hence the exposure system 10 to exposure position;

step S5) exposing the one(s) of the patterns by the exposure system 10, concurrently with the measurement system 40 performing a measurement for determining another exposure position suitable for the exposure of other one(s) of the patterns to be subsequently exposed;

step S6) adjusting the reticle stage 80 into an orientation suitable for the exposure of the one(s) of the patterns to be subsequently exposed;

step S7) exposing the one(s) of the patterns by the exposure system 10;

step S8) moving the exposure system 10 to a further exposure position;

step S9) repeating steps S2-S8 until all the exposure positions have been traversed, and rotating the feed roller 51 and pickup roller 52 to advance another portion of the flexible conductive film 20 to be exposed onto the retention platform 53; and step S10) repeating steps S2-S9 until all patterns on the flexible conductive film 20 have been exposed.

In the method, step S8 may be omitted if the scanning field of view of the exposure system 10 can entirely encompass the portion of the flexible conductive film 20 retained on the retention platform 53.

The exposure apparatus of Embodiment 4 differs from that of Embodiment 3 only in that the retention platform in the exposure apparatus of Embodiment 4 further includes the measurement section 53 and the exposure section 54. As a result, compared to the exposure method using the exposure apparatus of Embodiment 3, in the exposure method using the exposure apparatus of Embodiment 4, concurrently with the exposure performed by the exposure system 10 on the current portion of the flexible conductive film 20 that is retained by the exposure section 54, the measurement system 40 performs horizontal and vertical position measurements on the portion of the flexible conductive film 20 that is retained on the measurement section 53 and is to be exposed subsequently, resulting in a significant improvement in the throughput. As this has been described above, a detailed description of corresponding method steps will be omitted here.

In summary, the light spot switching unit in the exposure system of the present invention enables the laser beam to be switched between the different optical paths so as to form light spots sized in different ranges, which can satisfy different needs of workpieces with various critical dimensions. As a result, an improvement in processing adaptability and a significant reduction in cost can be achieved. Moreover, a significant improvement in the throughput can be achieved by the retention platform incorporated in the roll-to-roll conveyor and including the measurement section and the exposure section, on which different portions of the flexible substrate are retained and undergo simultaneous horizontal and vertical position measurement by the measurement system and exposure by the exposure system, respectively.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. An exposure system, comprising: a laser unit, a light spot switching unit and a lens unit, the laser unit configured to produce a laser beam, the light spot switching unit comprising a first optical path including a first aperture and a second optical path including a second aperture, the light spot switching unit configured to direct the laser beam to travel along one of the first and second optical paths by controlling an opening or closing status of the first aperture and the second aperture based on a desired size of a light spot for a workpiece to be exposed so that a laser beam in correspondence with the desired size of the light spot is obtained, the lens unit configured to alter a direction in which the laser beam is incident on the workpiece, the first optical path configured to generate a first light spot that is adjustable in size and has a size smaller than the threshold light spot size, the second optical path configured to generate a second light spot that is adjustable in size and has a size greater than or equal to the threshold light spot size, and the laser unit comprising a beam expansion assembly for expanding the laser beam so that the size of the light spot is able to be adjusted in field.

2. The exposure system of claim 1, wherein the exposure system determines the desired size of the light spot for the workpiece based on a power density of the light spot that is required to be applied on a surface of the workpiece, selects the one of the first and second optical paths based on a comparison of the desired size of the light spot with a threshold light spot size, and controls the light spot switching unit to enable the selected optical path.

3. The exposure system of claim 1, wherein the threshold light spot size is 100 µm.

4. The exposure system of claim 1, wherein the first optical path is defined by a first reflector, the first aperture, a second reflector and an optical element, and wherein the second optical path is defined by a focusing lens group, the second aperture and the optical element.

5. The exposure system of claim 4, wherein the light spot switching unit further comprises a beam splitting prism configured to split the laser beam into a first beam following the first optical path and a second beam following the second optical path.

6. The exposure system of claim 1, wherein the laser unit comprises: a light source assembly for outputting the laser beam; and a shaping assembly for controlling a shape of the light spot.

7. The exposure system of claim 1, wherein the lens unit comprises a two-dimensional galvanometer scanner and a telecentric field lens; the two-dimensional galvanometer scanner is configured for deflecting the laser beam in an X- or Y-direction and the telecentric field lens is configured for ensuring normal incidence of the laser beam on the workpiece.

8. An exposure apparatus, comprising an exposure system, a workpiece stage and a measurement system, wherein the exposure system is the exposure system as defined in claim 1.

9. The exposure apparatus of claim 8, wherein a workpiece placed on the workpiece stage is a rigid substrate, and wherein the measurement system is configured to align the rigid substrate with the exposure system.

10. The exposure apparatus of claim 8, wherein a workpiece placed on the workpiece stage is a flexible substrate, and wherein the workpiece stage is a roll-to-roll conveyor.

11. The exposure apparatus of claim 10, wherein the roll-to-roll conveyor comprises: a feed roller and a pickup roller which are disposed in left-right symmetry with each other; and a retention platform configured for absorptive retention of the flexible substrate.

12. The exposure apparatus of claim 11, wherein the retention platform comprises a measurement section and an exposure section.

13. The exposure apparatus of claim 10, wherein the measurement system comprises: an alignment sensor configured to perform a horizontal position measurement; a vertical sensor configured to perform a vertical position measurement; and a motion mechanism capable of moving in multiple degrees of freedom.

14. The exposure apparatus of claim 13, further comprising a reticle and a reticle stage; wherein the reticle is configured for replicating identical exposure patterns and the reticle stage is configured to carry the reticle to move in the multiple degrees of freedom.

15. An exposure method, comprising the steps of:
1) placing a workpiece on a workpiece stage, wherein the workpiece is in correspondence with a desired size of a light spot that is determined based on a power density of the light spot that is required to be applied on a surface of the workpiece;
2) comparing the desired size of the light spot with a threshold light spot size to obtain a comparison result;

3) selecting one of a first optical path and a second optical path based on the comparison result and enabling the selected optical path by controlling an opening or closing status of a first aperture disposed in the first optical path and a second aperture disposed in the second optical path; and
4) producing, by a laser unit, a laser beam which is directed along the selected optical path and exposes a pattern on a reticle onto the workpiece,
wherein the first optical path is configured to generate a first light spot that is adjustable in size and has a size smaller than the threshold light spot size, wherein the second optical path is configured to generate a second light spot that is adjustable in size and has a size greater than or equal to the threshold light spot size, and wherein the laser unit comprises a beam expansion assembly for expanding the laser beam so that the size of the light spot is able to be adjusted in field.

16. The exposure method of claim 15, wherein the threshold light spot size is 100 μm.

17. The exposure method of claim 15, further comprising, prior to step 4, a measurement step in which the workpiece undergoes an alignment measurement and/or a vertical measurement.

18. The exposure method of claim 17, wherein the workpiece is a rigid substrate, and wherein an alignment measurement with respect to an exposure position is performed on the rigid substrate prior to step 4.

19. The exposure method of claim 17, wherein the workpiece placed on the workpiece stage is a flexible substrate, wherein both an alignment measurement and a vertical measurement with respect to an exposure position are performed on the flexible substrate prior to step 4, and wherein the workpiece stage is a roll-to-roll conveyor.

20. The exposure method of claim 19, wherein the roll-to-roll conveyor comprises: a feed roller and a pickup roller which are disposed in left-right symmetry with each other; and a retention platform configured for absorptive retention of the flexible substrate.

21. The exposure method of claim 20, wherein the retention platform comprises a measurement section and an exposure section.

* * * * *